US006838125B2

(12) United States Patent
Chung et al.

(10) Patent No.: US 6,838,125 B2
(45) Date of Patent: Jan. 4, 2005

(54) METHOD OF FILM DEPOSITION USING ACTIVATED PRECURSOR GASES

(75) Inventors: Hua Chung, San Jose, CA (US); Ling Chen, Sunnyvale, CA (US); Vincent W. Ku, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 193 days.

(21) Appl. No.: 10/193,574

(22) Filed: Jul. 10, 2002

(65) Prior Publication Data

US 2004/0018304 A1 Jan. 29, 2004

(51) Int. Cl.$^7$ ................................................ C23C 16/34

(52) U.S. Cl. ........................ 427/562; 427/564; 427/576; 427/586; 427/255.391; 427/255.392; 427/255.394; 427/252; 427/253; 427/255.7; 438/680; 438/681; 438/685

(58) Field of Search ................................. 438/680, 681, 438/685; 427/562, 564, 576, 586, 255.391, 255.392, 255.394, 252, 253, 255.7

(56) References Cited

U.S. PATENT DOCUMENTS

| | | | |
|---|---|---|---|
| 4,389,973 A | 6/1983 | Suntola et al. | |
| 4,413,022 A | 11/1983 | Suntola et al. | |
| 4,486,487 A | 12/1984 | Skarp | |
| 5,114,556 A | 5/1992 | Lamont, Jr. | 204/192.12 |
| 5,262,610 A | 11/1993 | Huang et al. | 219/121.43 |
| 5,306,666 A | 4/1994 | Izumi | |
| 5,374,570 A | 12/1994 | Nasu et al. | |
| 5,526,244 A | 6/1996 | Bishop | |
| 5,630,880 A | 5/1997 | Eastlund | 118/723 MP |

(List continued on next page.)

FOREIGN PATENT DOCUMENTS

| | | | |
|---|---|---|---|
| EP | 0 499 294 A1 | 8/1992 | ......... H01L/21/203 |
| EP | 1167569 A1 | 1/2002 | |
| GB | 2355727 A | 5/2001 | |
| JP | 02-246161 | 10/1990 | |
| JP | 07-300649 | 11/1995 | |
| JP | 10-308283 | 11/1999 | |
| JP | 2000-031387 A | 1/2000 | |
| JP | 2000-058777 A | 2/2000 | |
| JP | 2000-178735 A | 6/2000 | |

(List continued on next page.)

OTHER PUBLICATIONS

Conference Report for the 2$^{nd}$ International Conference on CAT–CVD (Hot–Wire CVD) Process, Denver, Colorado, Sep. 10–14, 2002.

Waghmare, P., et al. Ultra–thin silicon nitride by the hot wire chemical vapor deposition (HWCVD) for deep sub–micron CMOS technologies, Microelectronic Engineering 61–62 (2002) 625–629.

Yokoyama, Shin, et al. "Atomic–layer Deposition of Silicon Nitride," Journal of the Korean Physical Society, vol. 35, Jul. 1999, pp. S71–S75.

(List continued on next page.)

*Primary Examiner*—Timothy Meeks
(74) *Attorney, Agent, or Firm*—Moser, Patterson & Sheridan LLP

(57) ABSTRACT

A method for depositing a film on a substrate is provided. In one aspect, the method includes providing a metal-containing precursor to an activation zone, and activating the metal-containing precursor to form an activated precursor. The activated precursor gas is transported to a reaction chamber, and a film is deposited on the substrate using a cyclical deposition process, wherein the activated precursor gas and a reducing gas are alternately adsorbed on the substrate. Also provided is a method of depositing a film on a substrate using an activated reducing gas.

24 Claims, 6 Drawing Sheets

U.S. PATENT DOCUMENTS

| | | | |
|---|---|---|---|
| 5,711,811 A | 1/1998 | Suntola et al. | |
| 5,779,802 A | 7/1998 | Borghs et al. | 118/723 MP |
| 5,804,488 A | 9/1998 | Shih et al. | |
| 5,902,404 A | 5/1999 | Fong et al. | 118/723 ME |
| 5,916,365 A | 6/1999 | Sherman | 117/92 |
| 5,923,056 A | 7/1999 | Lee et al. | |
| 5,964,949 A | 10/1999 | Savas | 118/723 I |
| 5,972,430 A | 10/1999 | DiMeo, Jr. et al. | 427/255.32 |
| 6,015,590 A | 1/2000 | Suntola et al. | |
| 6,015,917 A | 1/2000 | Bhandari et al. | |
| 6,042,652 A | 3/2000 | Hyun et al. | |
| 6,071,572 A | 6/2000 | Mosely et al. | 427/570 |
| 6,084,302 A | 7/2000 | Sandhu | |
| 6,124,158 A | 9/2000 | Dautartas et al. | |
| 6,139,700 A | 10/2000 | Kang et al. | |
| 6,144,060 A | 11/2000 | Park et al. | |
| 6,174,809 B1 | 1/2001 | Kang et al. | |
| 6,179,919 B1 | 1/2001 | Liao | 118/715 |
| 6,197,683 B1 | 3/2001 | Kang et al. | |
| 6,200,893 B1 | 3/2001 | Sneh | 438/685 |
| 6,203,613 B1 | 3/2001 | Gates et al. | |
| 6,207,302 B1 | 3/2001 | Sugiura et al. | |
| 6,207,487 B1 | 3/2001 | Kim et al. | |
| 6,218,298 B1 | 4/2001 | Hoinkis | |
| 6,270,572 B1 | 8/2001 | Kim et al. | |
| 6,284,646 B1 | 9/2001 | Leem | |
| 6,287,965 B1 | 9/2001 | Kang et al. | |
| 6,305,314 B1 * | 10/2001 | Sneh et al. | 118/723 R |
| 6,333,260 B1 | 12/2001 | Kwon et al. | |
| 6,335,280 B1 | 1/2002 | Van der Jeugd | |
| 6,337,289 B1 | 1/2002 | Narwankar et al. | 438/776 |
| 6,342,277 B1 * | 1/2002 | Sherman | 427/562 |
| 6,348,376 B2 | 2/2002 | Lim et al. | |
| 6,355,561 B1 | 3/2002 | Sandhu et al. | |
| 6,358,829 B2 | 3/2002 | Yoon et al. | |
| 6,368,954 B1 | 4/2002 | Lopatin et al. | |
| 6,369,430 B1 | 4/2002 | Adetutu et al. | |
| 6,372,598 B2 | 4/2002 | Kang et al. | |
| 6,379,748 B1 | 4/2002 | Bhandari et al. | |
| 6,391,785 B1 * | 5/2002 | Satta et al. | 438/704 |
| 6,399,491 B2 | 6/2002 | Jeon et al. | |
| 6,416,577 B1 | 7/2002 | Suntoloa et al. | 117/88 |
| 6,416,822 B1 | 7/2002 | Chiang et al. | |
| 6,420,189 B1 | 7/2002 | Lopatin | |
| 6,423,619 B1 | 7/2002 | Grant et al. | |
| 6,428,859 B1 | 8/2002 | Chiang et al. | |
| 6,447,933 B1 | 9/2002 | Wang et al. | |
| 6,451,119 B2 | 9/2002 | Sneh et al. | |
| 6,451,695 B2 | 9/2002 | Sneh | |
| 6,458,701 B1 | 10/2002 | Chae et al. | |
| 6,468,924 B2 | 10/2002 | Lee et al. | |
| 6,475,276 B1 | 11/2002 | Elers et al. | |
| 6,475,910 B1 | 11/2002 | Sneh | |
| 6,478,872 B1 | 11/2002 | Chae et al. | |
| 6,482,262 B1 | 11/2002 | Elers et al. | |
| 6,482,733 B2 | 11/2002 | Raaijmakers et al. | |
| 6,482,740 B2 | 11/2002 | Soininen et al. | |
| 6,511,539 B1 * | 1/2003 | Raaijmakers | 117/102 |
| 6,534,395 B2 | 3/2003 | Werkhoven et al. | |
| 6,548,424 B2 | 4/2003 | Putkonen | |
| 6,551,929 B1 | 4/2003 | Kori et al. | |
| 6,569,501 B2 * | 5/2003 | Chiang et al. | 427/535 |
| 6,585,823 B1 | 7/2003 | Van Wijck et al. | |
| 6,599,572 B2 | 7/2003 | Saanila et al. | |
| 6,607,976 B2 | 8/2003 | Chen et al. | |
| 6,620,723 B1 | 9/2003 | Byun et al. | |
| 6,632,279 B1 | 10/2003 | Ritala et al. | |
| 6,660,126 B2 | 12/2003 | Nguyen et al. | |
| 6,686,271 B2 | 2/2004 | Raaijmakers et al. | |
| 2001/0000866 A1 | 5/2001 | Sneh et al. | 118/723 IR |
| 2001/0002280 A1 | 5/2001 | Sneh | 427/255.28 |
| 2001/0009140 A1 | 7/2001 | Bondestam et al. | |
| 2001/0009695 A1 | 7/2001 | Saanila et al. | |
| 2001/0024387 A1 | 9/2001 | Raaijmakers et al. | |
| 2001/0024871 A1 | 9/2001 | Yagi | |
| 2001/0025979 A1 | 10/2001 | Kim et al. | |
| 2001/0028924 A1 | 10/2001 | Sherman | |
| 2001/0029094 A1 | 10/2001 | Mee-Young et al. | |
| 2001/0031541 A1 | 10/2001 | Madan et al. | 438/482 |
| 2001/0034123 A1 | 10/2001 | Jeon et al. | |
| 2001/0041250 A1 | 11/2001 | Werkhoven et al. | |
| 2001/0050039 A1 | 12/2001 | Park | |
| 2001/0054730 A1 | 12/2001 | Kim et al. | |
| 2001/0054769 A1 | 12/2001 | Raaijmakers et al. | |
| 2002/0000598 A1 | 1/2002 | Kang et al. | |
| 2002/0004293 A1 | 1/2002 | Soininen et al. | |
| 2002/0007790 A1 | 1/2002 | Park | |
| 2002/0019121 A1 | 2/2002 | Pyo | |
| 2002/0020869 A1 | 2/2002 | Park et al. | |
| 2002/0021544 A1 | 2/2002 | Cho et al. | |
| 2002/0031618 A1 | 3/2002 | Sherman | |
| 2002/0037630 A1 | 3/2002 | Agarwal et al. | |
| 2002/0041931 A1 | 4/2002 | Suntola et al. | |
| 2002/0048635 A1 | 4/2002 | Kim et al. | |
| 2002/0048880 A1 | 4/2002 | Lee | |
| 2002/0052097 A1 | 5/2002 | Park | |
| 2002/0055235 A1 | 5/2002 | Agarwal et al. | |
| 2002/0060363 A1 | 5/2002 | Xi et al. | |
| 2002/0061612 A1 | 5/2002 | Sandhu et al. | |
| 2002/0068458 A1 | 6/2002 | Chiang et al. | |
| 2002/0073924 A1 | 6/2002 | Chiang et al. | |
| 2002/0074588 A1 | 6/2002 | Lee | |
| 2002/0076481 A1 | 6/2002 | Chiang et al. | |
| 2002/0076507 A1 | 6/2002 | Chiang et al. | |
| 2002/0076508 A1 | 6/2002 | Chiang et al. | |
| 2002/0076837 A1 | 6/2002 | Hujanen et al. | |
| 2002/0081844 A1 | 6/2002 | Jeon et al. | |
| 2002/0086111 A1 | 7/2002 | Byun et al. | |
| 2002/0090829 A1 | 7/2002 | Sandhu et al. | |
| 2002/0094689 A1 | 7/2002 | Park | |
| 2002/0098627 A1 | 7/2002 | Pomarede et al. | |
| 2002/0104481 A1 | 8/2002 | Chiang et al. | |
| 2002/0105088 A1 | 8/2002 | Yang et al. | |
| 2002/0106536 A1 | 8/2002 | Lee et al. | |
| 2002/0106846 A1 | 8/2002 | Seutter et al. | |
| 2002/0109168 A1 | 8/2002 | Kim et al. | |
| 2002/0117399 A1 | 8/2002 | Chen et al. | |
| 2002/0121241 A1 | 9/2002 | Nguyen et al. | |
| 2002/0121342 A1 | 9/2002 | Nguyen et al. | |
| 2002/0121697 A1 | 9/2002 | Marsh | |
| 2002/0135071 A1 | 9/2002 | Kang et al. | |
| 2002/0144655 A1 | 10/2002 | Chiang et al. | |
| 2002/0144657 A1 | 10/2002 | Chiang et al. | |
| 2002/0146511 A1 | 10/2002 | Chiang et al. | |
| 2002/0155722 A1 | 10/2002 | Satta et al. | |
| 2002/0162506 A1 | 11/2002 | Sneh et al. | |
| 2002/0164421 A1 | 11/2002 | Chiang et al. | |
| 2002/0164423 A1 | 11/2002 | Chiang et al. | |
| 2002/0177282 A1 | 11/2002 | Song | |
| 2002/0182320 A1 | 12/2002 | Leskela et al. | |
| 2002/0187256 A1 | 12/2002 | Elers et al. | |
| 2002/0187631 A1 | 12/2002 | Kim et al. | |
| 2002/0197402 A1 | 12/2002 | Chiang et al. | |
| 2002/0197863 A1 | 12/2002 | Mak et al. | |
| 2003/0013300 A1 | 1/2003 | Byun | |
| 2003/0013320 A1 | 1/2003 | Kim et al. | |
| 2003/0031807 A1 | 2/2003 | Elers et al. | |
| 2003/0032281 A1 | 2/2003 | Werkhoven et al. | |
| 2003/0042630 A1 | 3/2003 | Babcoke et al. | |
| 2003/0049931 A1 | 3/2003 | Byun et al. | |
| 2003/0049942 A1 | 3/2003 | Haukka et al. | |

| | | | |
|---|---|---|---|
| 2003/0053799 A1 | 3/2003 | Lei | |
| 2003/0054631 A1 | 3/2003 | Raaijmakers et al. | |
| 2003/0057526 A1 | 3/2003 | Chung et al. | |
| 2003/0057527 A1 | 3/2003 | Chung et al. | |
| 2003/0059538 A1 | 3/2003 | Chung et al. | |
| 2003/0072884 A1 | 4/2003 | Zhang et al. | |
| 2003/0072975 A1 | 4/2003 | Shero et al. | |
| 2003/0079686 A1 | 5/2003 | Chen et al. | |
| 2003/0082296 A1 | 5/2003 | Elers et al. | |
| 2003/0082300 A1 | 5/2003 | Todd et al. | |
| 2003/0082301 A1 | 5/2003 | Chen et al. | |
| 2003/0082307 A1 | 5/2003 | Chung et al. | |
| 2003/0089308 A1 | 5/2003 | Raaijmakers | |
| 2003/0101927 A1 | 6/2003 | Raaijmakers | |
| 2003/0104126 A1 | 6/2003 | Fang et al. | |
| 2003/0106490 A1 | 6/2003 | Jallepally et al. | |
| 2003/0108674 A1 | 6/2003 | Chung et al. | |
| 2003/0113187 A1 | 6/2003 | Lei et al. | |
| 2003/0116087 A1 | 6/2003 | Nguyen et al. | |
| 2003/0121608 A1 | 7/2003 | Chen et al. | |
| 2003/0123216 A1 | 7/2003 | Yoon et al. | |
| 2003/0124262 A1 | 7/2003 | Chen et al. | |
| 2003/0129826 A1 | 7/2003 | Werkhoven et al. | |
| 2003/0134508 A1 | 7/2003 | Raaijamkers et al. | |
| 2003/0143328 A1 | 7/2003 | Chen et al. | |
| 2003/0143839 A1 | 7/2003 | Raaijmakers et al. | |
| 2003/0143841 A1 | 7/2003 | Yang et al. | |
| 2003/0153181 A1 | 8/2003 | Yoon et al. | |
| 2003/0161952 A1 | 8/2003 | Wang et al. | |
| 2003/0165615 A1 | 9/2003 | Aaltonen et al. | |
| 2003/0168750 A1 | 9/2003 | Basceri et al. | |
| 2003/0173586 A1 | 9/2003 | Moriwaki et al. | |
| 2003/0186495 A1 | 10/2003 | Saanile et al. | |
| 2003/0190423 A1 | 10/2003 | Yang et al. | |
| 2003/0190497 A1 | 10/2003 | Yang et al. | |
| 2003/0190804 A1 | 10/2003 | Glenn et al. | |
| 2003/0194493 A1 | 10/2003 | Chang et al. | |
| 2003/0194825 A1 | 10/2003 | Law et al. | |
| 2003/0203616 A1 | 10/2003 | Chung et al. | |
| 2003/0205729 A1 | 11/2003 | Basceri et al. | |
| 2003/0224217 A1 | 12/2003 | Byun et al. | |
| 2003/0224578 A1 | 12/2003 | Chung et al. | |
| 2003/0224600 A1 | 12/2003 | Cao et al. | |
| 2004/0011504 A1 | 1/2004 | Ku et al. | |
| 2004/0013577 A1 | 1/2004 | Ganguli et al. | |
| 2004/0013803 A1 | 1/2004 | Chung et al. | |
| 2004/0014315 A1 | 1/2004 | Lai et al. | |
| 2004/0014320 A1 | 1/2004 | Chen et al. | |
| 2004/0015300 A1 | 1/2004 | Ganguil et al. | |
| 2004/0018304 A1 | 1/2004 | Chung et al. | |
| 2004/0018723 A1 | 1/2004 | Byun et al. | |
| 2004/0041320 A1 | 3/2004 | Hodumi | |

FOREIGN PATENT DOCUMENTS

| | | | | |
|---|---|---|---|---|
| JP | 2001-111000 A | 4/2001 | | |
| JP | 2001-172767 A | 6/2001 | | |
| JP | 2001-220294 A | 8/2001 | | |
| JP | 2001-254181 A | 9/2001 | | |
| WO | WO 96/17107 | 6/1996 | | |
| WO | WO 98/51838 | 11/1998 | | |
| WO | WO 99/01595 | 1/1999 | | |
| WO | WO 99/29924 | 6/1999 | | |
| WO | 99/29924 | 6/1999 | ........... | C23C/16/04 |
| WO | WO 99/65064 | 12/1999 | | |
| WO | WO 00/15865 | 3/2000 | | |
| WO | WO 00/16377 | 3/2000 | | |
| WO | WO 00/54320 | 9/2000 | | |
| WO | WO 00/63957 | 10/2000 | | |
| WO | WO 00/79576 A1 | 12/2000 | | |
| WO | WO 01/15220 A1 | 3/2001 | | |
| WO | WO 01/17692 A1 | 3/2001 | | |
| WO | WO 01/27346 A1 * | 4/2001 | | |
| WO | 01/27346 | 4/2001 | ........... | C23C/16/44 |
| WO | WO 01/27347 A1 | 4/2001 | | |
| WO | WO 01/29280 A1 | 4/2001 | | |
| WO | WO 01/29891 A1 | 4/2001 | | |
| WO | WO 01/29893 A1 | 4/2001 | | |
| WO | WO 01/36702 A1 | 5/2001 | | |
| WO | WO 01/66832 | 9/2001 | | |
| WO | WO 02/01628 A2 | 1/2002 | | |
| WO | WO 02/08485 A2 | 1/2002 | | |
| WO | WO 02/43114 A2 | 5/2002 | | |
| WO | WO 02/43115 A2 | 5/2002 | | |
| WO | WO 02/45167 A2 | 6/2002 | | |
| WO | WO 02/45871 A1 | 6/2002 | | |
| WO | WO 02/067319 A2 | 8/2002 | | |

OTHER PUBLICATIONS

Yokoyama, S., "Atomic–layer selective deposition of silicon nitride on hydrogen–terminated Si surfaces," Applied Surface Science 130–132 (1998) 352–356.

Apen, E., et al. "Ammonia adsorption and decomposition on the GaAs(100)—c(8×2) surface" Surface Science 321 (1994) 301–307.

Bedair, S.M., et al. "Atomic layer epitaxy deposition processes," J. Vac. Sci. Technol. B 12(1), Jan./Feb. 1994.

Imai, S., et al. "Atomic layer epitaxy of Si using atomic H," Thin Solid Films, 225 (1993) 168–172.

Yates, Jr., et al. "Atomic H: a reagent for the extraction of chemical species from Si surfaces," Thin Solid Films, 225 (1993).

Hukka, T., et al., "Novel method for chemical vapor deposition and atomic layer epitaxy using radical chemistry," Thin Solid Films, 225 (1993).

Colaianni, M.L., et al. "The stepwise dissociation of $NH_3$ on the Si(111)–(7x 7) surface: Low–temperature dissociative adsorption and thermal effects," J. Chem. Phys. 96(10), May 15, 1992.

DeKeijser, M., et al. "Atomic layer epitaxy of gallium arsenide with the use of atomic hydrogen," Appl. Phys. Lett. 58(11), Mar. 18, 1991.

Baillargeon, J.N., et al. "Investigation of the thermal dissociation of $PH_3$ and $NH_3$ using quadrupole mass spectrometry," J. Appl. Phys. 69(12) Jun. 15, 1991.

Davidson, D.F., et al. "A Pyrolysis Mechanism for Ammonia," Int'l J. of Chem. Kin., vol. 22, 513–535 (1990).

King, D.A., et al. "Fundamental Studies of Heterogeneous Catalysis," The Chemical Physics of Solid Surfaces and Heterogeneous Catalysis (1982).

Langmuir, I. "The Dissociation of Hydrogen into Atoms," JACS, 34, 860 (1912).

Clark–Phelps, et al. "Engineered Tantalum Alumiate and Hafnium Aluminate ALD Films for Ultrathin Dielectric Films with Improved Electrical and Thermal Properties," Mat. Res. Soc. Symp. Proc. vol. 670 (2001).

De Keijser, et al., "Atomic Layer Epitaxy of Gallium Arsenide with the Use of Atomic Hydrogen", Applied Physics Letters, Mar. 18, 1991, USA, vol. 58, No. 11, pp. 1187–1189, XP002268294.

Eisenbraum, et al. "Atomic Layer Deposition (ALD) of Tantalum–based materials for zero thickness copper barrier applications," Proceedings of the IEEE 2001 International Interconnect Technology Conference (Cat. No. 01EX461) 2001.

George, et al. "Surface Chemistry for Atomic Layer Growth," J. Phys. Chem. 1996, 100, 13121–13131.

Hwang, et al. "Nanometer–Size α–PbO$_2$–type TiO$_2$ in Garnet: A Thermobarometer for Ultrahigh–Pressure Metamorphism," Science vol. 288 (Apr. 14, 2000).

Juppo, et al., Trimethylaluminum as a Reducing Agent in the Atomic Layer Deposition of Ti(Al)N Thin Films, Chemical Vapor Deposition, VCH Publishers, Weinheim, DE, vol. 7, No. 5, Sep. 2001 (2001–9), pp. 211–217, XP001099852.

Kim, et al., The Growth of Tantalum Thin Films by Plasma–enhanced Atomic Layer Deposition and Diffusion Barrier Properties, Silicon Materials—Processing, Characterization and Reliability Symposium (Mater. Res. Soc. Proceedings vol. 716), Silicon Material– Processing, Characterization and Reliability Symposium, San Francisco, CA, USA, Apr. 1–5, 2002, pp. 407–412, XP008026978, 2002, Warrendale, PA, USA, Mater. Res. Soc, USA.

Klaus, et al. "Atomic Layer Deposition of SiO$_2$ Using Catalyzed and Uncatalyzed Self–Limiting Surface Reactions," Surface Review and Letters, vol. 6, Nos. 3 & 4 (1999) 435–448.

Klaus, et al. "Atomically Controlled Growth of Tungsten and Tungsten Nitride Using Sequential Surface Reactions," Applied Surface Science, 162–163 (2000) 479–491.

Kukli, et al. "Atomic Layer Epitaxy Growth of Tantalum Oxide Thin Films from Ta(OC$_2$H$_5$)$_5$ and H$_2$O," Journal of the Electrochemical Society, vol. 142, No. 5, May 1995; p. 1670–5.

Kukli, et al., "In situ Study of Atomic Layer Epitaxy Growth of Tantalum Oxide Thin Films From Ta(OC$_2$H$_5$)$_5$ and H$_2$O," Applied Surface Science, vol. 112, Mar. 1997, p. 236–42.

Kukli, et al., "Properties of {Nb$_{1-x}$Ta$_x$}$_2$O$_5$ Solid Solutions and {Nb$_{1-x}$Ta$_x$}$_2$O$_5$–ZrO$_2$ Nanolaminates Grown by Atomic Layer Epitaxy," 1997; p. 785–93.

Kukli, et al., "Properties of Ta$_2$O$_5$–Based Dielectric Nanolaminates Deposited by Atomic Layer Epitaxy," Journal of the Electrochemical Society, vol. 144, No. 1, Jan. 1997; p. 300–6.

Kukli, et al., "Tailoring the Dielectric Properties of HIO$_2$–Ta$_2$O$_5$ Nanolaminates," Applied Physics Letters, vol. 68, No. 26, Jun. 24, 1996; p. 3737–9.

Martensson, et al. "Use of Atomic Layer Epitaxy for Fabrication of Si/TiN/Cu Structures," J. Vac. Sci. & Tech. B, vol. 17, No. 5 (Sep. 1999) pp. 2122–2128.

Min, et al. "Atomic Layer Deposition of TiN Thin Films by Sequential Introduction of Ti Precursor and NH3," Mat. Res. Soc. Symp. Proc. vol. 514 (1998).

Min, et al. "Chemical Vapor Deposition of Ti—Si—N Films With Alternating Source Supply," Mat. Rec. Soc. Symp. Proc. vol. (1999).

Min, et al. "Metal–organic Atomic–layer Deposition of Titanium–silicon–nitride films," Applied Physics Letters, vol. 75, No. 11 (Sep. 13, 1999).

Niinisto, et al. "Synthesis of Oxide Thin Films and Overlayers by Atomic Layer Epitaxy for Advanced Applications," Materials Science and Engineering B41 (1996) 23–29.

Park, et al., "Plasma–Enhanced Atomic Layer Deposition of Ta—N Thin Films", Journal of the Electrochemical Society, Jan. 2002, Electrochem. Soc., USA, vol. 149, No. 1, pp. C28–C32, XP002268295.

Proceedings of the ICEEE 1998 International Interconnect Technology Conference—San Francisco, California, Jun. 1–3, 1998.

Ritala, et al. "Atomic Force Microscopy Study of Titanium Dioxide Thin Films Grown by Atomic Layer Epitaxy," Thin Solid Films, vol. 228, No. 1–2 (May 15, 1993), pp. 32–35.

Ritala, et al. "Atomic Layer Epitaxy Growth of TiN Thin Films," J. Electrochem. Soc., vol. 142, No. 8, Aug. 1995.

Ritala, et al. "Atomic Layer Epitaxy Growth of TiN Thin Films From TiI$_4$ and NH$_3$," J. Electrochem. Soc., vol. 145, No. 8 (Aug., 1998) pp. 2914–2920.

Ritala, et al., "Controlled Growth of TaN, Ta$_3$N$_5$, and TaO$_x$N$_y$ Thin Films by Atomic Layer Deposition", Chemistry of Materials, vol. 11, 1999, pp. 1712–1718, XP002268297.

Ritala, et al. "Effects of Intermediate Zinc Pulses on Properties of TiN and NbN Films by Atomic Layer Epitaxy," Applied Surface Science, vol. 120, No. 3–4, (Dec. 1997), pp. 199–212.

Ritala, et al. "Growth of Titanium Dioxide Thin Films by Atomic Layer Epitaxy," Thin Solid Films, vol. 225, No. 1–2 (Mar. 25, 1993), pp. 288–295.

Ritala, et al. "Perfectly Conformal TiN and Al$_2$O$_3$ Films Deposited by Atomic Layer Deposition," Chem. Vap. Deposition 1999, 5, No. 1.

Ritala, et al. "Surface Roughness Reduction in Atomic Layer Epitaxy Growth of Titanium Dioxide Thin Films," Thin Solid Films, vol. 249, No. 2 (Sep. 15, 1994), pp. 155–162.

Rossnagel, et al. "Plasma–enhanced Atomic Layer Deposition of Ta and Ti for Interconnect Diffusion Barriers," J. Vacuum Sci. & Tech. B., vol. 18, No. 4 (Jul. 2000), pp. 2016–2020.

Sheng, et al., "Decomposition of Trimethylgallium in the downstrea, region of a Near Afterglow Plasma", Applied Physics Letters, Dec. 4, 1989, USA, vol. 55, No. 23, pp. 2411–2413, XP002268298.

Yang, et al. "Atomic Layer Deposition of Tungsten Film from WF$_6$/B$_2$H$_6$: Nucleation Layer for Advanced Semiconductor Device," Conference Proceedings ULSI XVII (2002) Materials Research Society.

International Search Report for International Application No. PCT/US03/19706 (APPM/6171PCT) dated Feb. 2, 2004.

* cited by examiner

METHOD OF FILM DEPOSITION USING ACTIVATED PRECURSOR GASES

BACKGROUND OF THE DISCLOSURE

1. Field of the Invention

Embodiments of the present invention generally relate to methods of film deposition and, more particularly to methods of film deposition in which precursor gases are activated prior to cyclical introduction to a substrate.

2. Description of the Related Art

The deposition of thin films may be performed using any number of techniques. For many thin film applications, particularly those involving the formation of sub-micron-sized features for integrated circuits, vapor-phase deposition techniques are the most common. Vapor phase techniques include, for example, physical vapor deposition (PVD), chemical vapor deposition (CVD), plasma enhanced chemical vapor deposition (PECVD), and cyclical chemical vapor deposition, such as atomic layer deposition (ALD).

Cyclical deposition, by which monolayers of molecules are adsorbed onto a substrate, is particularly advantageous in forming thin films with a high-degree of step-coverage and film quality, as well as a low number of defects. Cyclical deposition also enables a high degree of control over film composition, thereby enabling the formation of thin films with functionality greater than other deposition methods. In a cyclical deposition process, precursor gases are alternately introduced into a reaction chamber.

While the precise chemical composition of each precursor gas varies depending upon the desired composition of the thin film, the precursor gases must have a high degree of reactivity. Unfortunately, not all highly reactive precursor gases are practical candidates for ALD because many of these gases cause safety concerns, or are otherwise dangerous to use in an industrial process. Consequently, precursor gases with less than optimal reactivity are often used for cyclical deposition. For example, precursor gases used for cyclical deposition may be large organic molecules that have a plurality of bulky side groups or ligands. The size and number of ligands within the precursor tend to shield the active metal ions to be deposited, thereby slowing the reaction kinetics of deposition. This may result in reduced or sub-optimal coverage of the thin film causing electrical failure of a device created using these deposition techniques.

Therefore, a need exists for a method of film deposition that provides a high degree of precursor reactivity as well as improved step coverage in the film.

SUMMARY OF THE INVENTION

A method for depositing a film on a substrate surface is provided. In one aspect, the method includes providing a metal-containing precursor to an activation zone, activating the metal-containing precursor to form an activated precursor, and alternately adsorbing the activated precursor and a first reducing gas to deposit a film on the substrate surface. In another aspect, the method includes providing a first reducing gas to an activation zone, activating the first reducing gas to form an activated reducing gas, and depositing a film on the substrate using a cyclical deposition process, wherein the activated reducing gas and a metal-containing precursor are alternately adsorbed on the substrate.

In still another aspect, the method includes providing a metal-containing precursor to an activation zone, activating the metal-containing precursor to form an activated precursor gas, providing a first reducing gas to an activation zone, activating the first reducing gas to form an activated reducing gas, and depositing a film on the substrate using a cyclical deposition process, wherein the activated reducing gas and a metal-containing precursor are alternately adsorbed on the substrate.

A method for forming an interconnect feature is also provided. The method includes providing a substrate structure having an aperture formed thereon to a reaction chamber, providing a first reducing gas to an activation zone, activating the first reducing gas to form an activated reducing gas, and depositing a barrier layer on the substrate structure using a cyclical deposition process, wherein the activated reducing gas and a metal-containing precursor are alternately adsorbed on the substrate structure.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
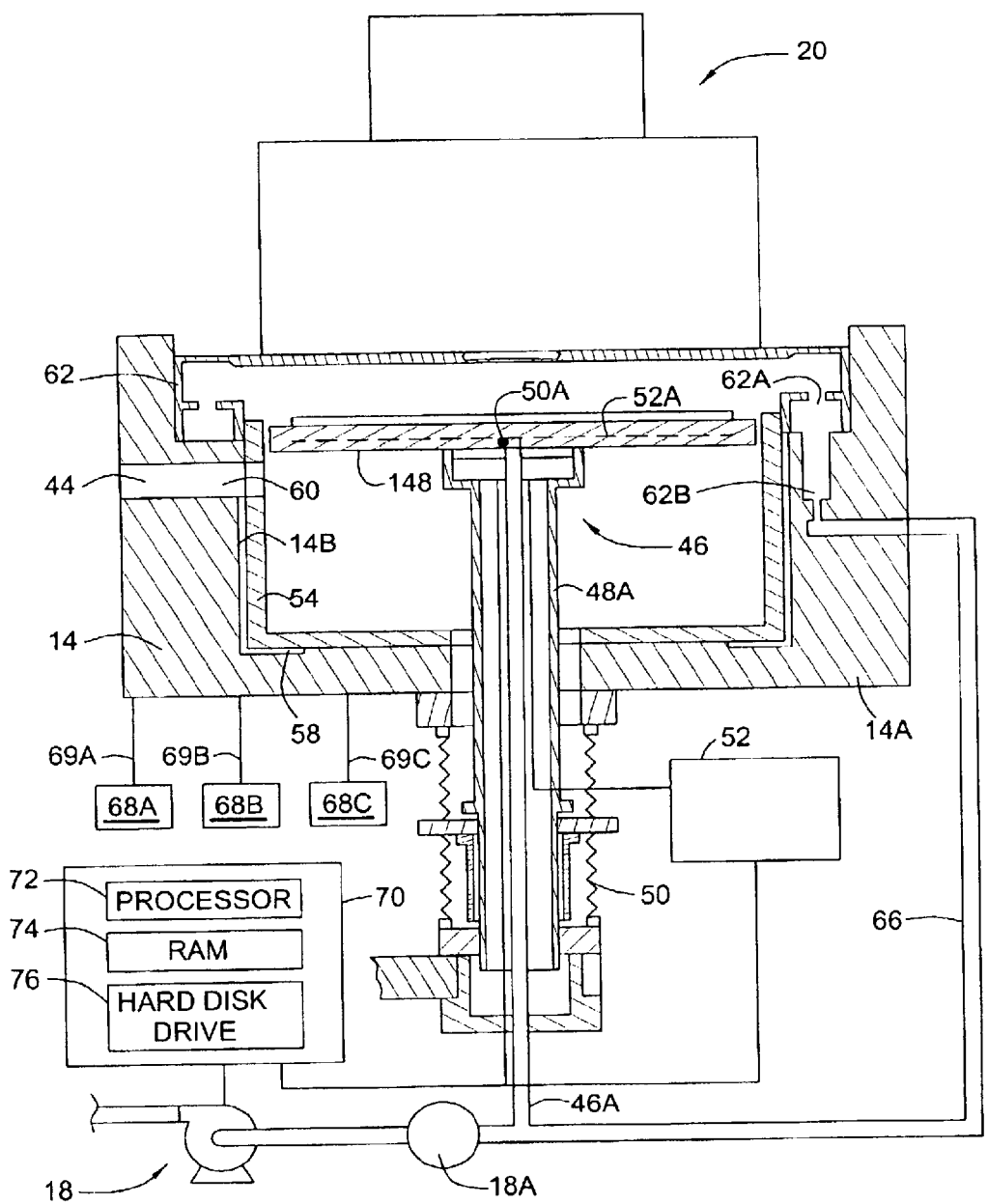
FIG. 1 is a partial cross-section view of a process chamber that can be used for the practice of embodiments described herein.

FIG. 1 depicts a partial cross-section view of an exemplary cyclical process chamber 10 that can be used to perform film deposition in accordance with embodiments described herein. The process chamber 10 generally includes an enclosure/body 90 that houses a support pedestal 48 that is moveable in a vertical direction inside the process chamber 10 using a displacement mechanism 48a. The process chamber 10 also includes a vacuum pump 18 to evacuate the body 90 and to maintain a pressure within the process chamber 10. The process chamber 10 further includes a gas delivery system 20 by which process gases are introduced into the body 90.

Depending on the specific process, the substrate 12 can be heated to some desired temperature prior to or during deposition. The substrate 12 may be heated using heat transfer from the support pedestal 48. Alternatively, the substrate 12 may be heated using radiant heaters such as, for example, lamps. In one aspect, the support pedestal 48 may be resistively heated by applying an electric current from an AC power supply 52 to a heater element 52a. A temperature sensor 50a, such as a thermocouple, is also embedded in the wafer support pedestal 48 to monitor the temperature of the pedestal 48 in a conventional manner. The measured temperature is used in a feedback loop to control the AC power supply 52 for the heating element 52a, such that the substrate temperature can be maintained or controlled at a desired temperature which is suitable for the particular process application.

The chamber 10 further includes a microprocessor controller 70 to control and regulate gas flow into the body 90. The microprocessor controller 70 may be one of any form of general purpose computer processor (CPU) that can be used in an industrial setting for controlling various chambers and sub-processors. The computer may use any suitable memory, such as random access memory, read only memory, floppy disk drive, hard disk, or any other form of digital storage, local or remote. Various support circuits may be coupled to the CPU for supporting the processor in a conventional manner. Software routines as required may be stored on the memory or executed by a second CPU that is remotely located.

The software routines are executed to initiate process recipes or sequences. The software routines, when executed, transform the general purpose computer into a specific process computer that controls the chamber operation so that a chamber process is performed. Alternatively, the software routines may be performed in hardware, as an application specific integrated circuit or other type of hardware implementation, or a combination of software or hardware.

Figure 2:
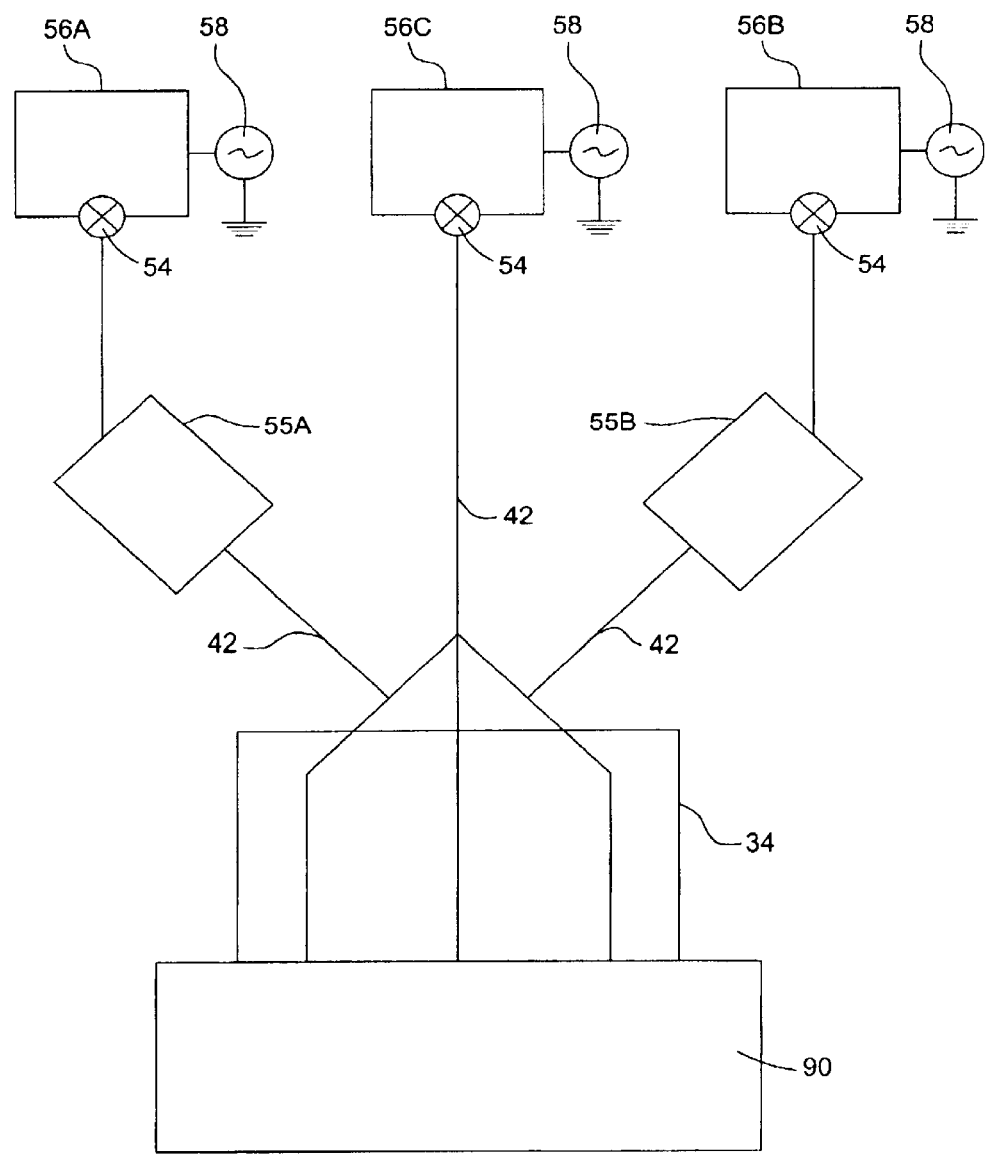
FIG. 2 is a schematic illustration of a gas delivery system that can be used for the practice of embodiments described herein.

FIG. 2 represents a schematic illustration of the gas delivery system 20. The gas delivery system 20 includes at least one gas inlet conduit 42 for each process gas used during deposition. Three gas inlet conduits 42 are shown for illustrative purposes. A "process gas" as used herein refers to one or more reactants, precursors, reductants, carrier gas, inert gas, purge gas, or any combination thereof.

The one or more gas conduits 42 extend into a gas manifold 34 at a first end thereof and are connected to one or more gas sources 56 (three are shown 56a, 56b, 56c) at a second end thereof. The gas conduits 42 may be heated by an external heater, such as heating tape for example, to maintain a desired temperature of the process gases contained therein. The gas manifold 34 allows the process gases to be introduced and uniformly distributed in the reaction chamber 90. Optionally, the gas manifold 34 may be heated to prevent condensation therein.

The one or more gas sources 56 each contain a particular process gas used for film deposition. For example, a first gas source 56a may contain a metal-containing precursor, a second gas source 56b may contain a reductant, and a third gas source 56c may contain one or more purge gases. Each gas source 56a, 56b, 56c may also include a heating member 58, such as a resistive coil heater for example, to maintain a temperature needed for proper storage and/or provide a temperature required by the deposition process. The heating member 58 may also be used to vaporize a liquid precursor to a gas, if needed.

The gas delivery system 20 also includes at least one valve 54 or other flow control mechanism to regulate a flow of the process gases from the gas sources 56 to the body 90. In one aspect, at least one valve 54 is disposed within each gas conduit 42. The valve 54 may be any high speed actuating valve, and may be pneumatically or electrically actuated, for example. However, the valve 54 should be capable of on/off cycle times as fast as about 1 second or less, such as about 100 milliseconds or less.

The gas delivery system 20 further includes one or more activation sources/zones (two are shown 55a, 55b) disposed along a fluid path between the gas sources 56 and the manifold 34. The residence time of the process gas through each of the activation zones 55 is as fast as the cycle time of the respective dosing valve 54. The activation sources 55 activate the one or more process gases prior to entering the body 90 by providing catalytic activation, pyrolytic/thermal activation, plasma-discharge activation, or any combination thereof. When more than one type of activation is desired, one or more activation sources 55 may be disposed in series. Alternatively, a separate chamber (not shown), such as a remote plasma source for example, may be disposed in fluid communication with the gas sources 56, and one or more of the activation zones 55a, 55b. Preferably, each activation zone 55a, 55b is disposed either adjacent the body 90 or directly onto the body 90. A close proximity to the body 90 is desired to prevent any loss of energy or activation. Each activation zone 55a, 55b may include a separate temperature control unit (not shown) to maintain a temperature within the activation zone. Each activation zone 55a, 55b may also include an exhaust port (not shown) through which reaction by-products may be removed.

An activation zone 55 utilizing catalytic activation may contain one or more metal-containing materials to activate a process gas flowing therethrough. For example, the catalytic materials may include one or more condensed phase materials such as magnesium, zinc, or combinations thereof. The catalytic materials may also include one or more gas phase materials containing one or more metals, such as sodium, potassium, rubidium, cesium, francium, lithium, beryllium, magnesium, calcium, strontium, barium, radium, zinc, and combinations thereof. These gas phase materials may be continuously delivered to the activation zones 55a, 55b by a separate gas supply 56.

An activation zone 55 utilizing plasma-discharge activation may contain a microwave power source, radio frequency (RF) power source, or a combination thereof, to generate a plasma for activating the one or more process gases. As mentioned above, the plasma may be generated in one or more of the activation zones 55 or alternatively, the plasma may be generated in a separate remote plasma generation chamber 60 and delivered to the activation zone 55. Each activation zone 55 or the remote plasma generation chamber 60 may be coupled to an energy source (not shown), such as, for example, an RF source or microwave source, to supply the energy needed to excite the process gases into a plasma state.

An activation zone 55a, 55b utilizing pyrolytic/thermal activation may include one or more sources of radiation or thermal energy to activate the one or process gases. Exemplary sources of radiation include infrared radiation and ultraviolet radiation. In one particular aspect, the source of radiation is a laser disposed within an activation zone 55. Exemplary sources of thermal energy include a resistive coil heating element and a hot filament.

Film Deposition

Figure 3:
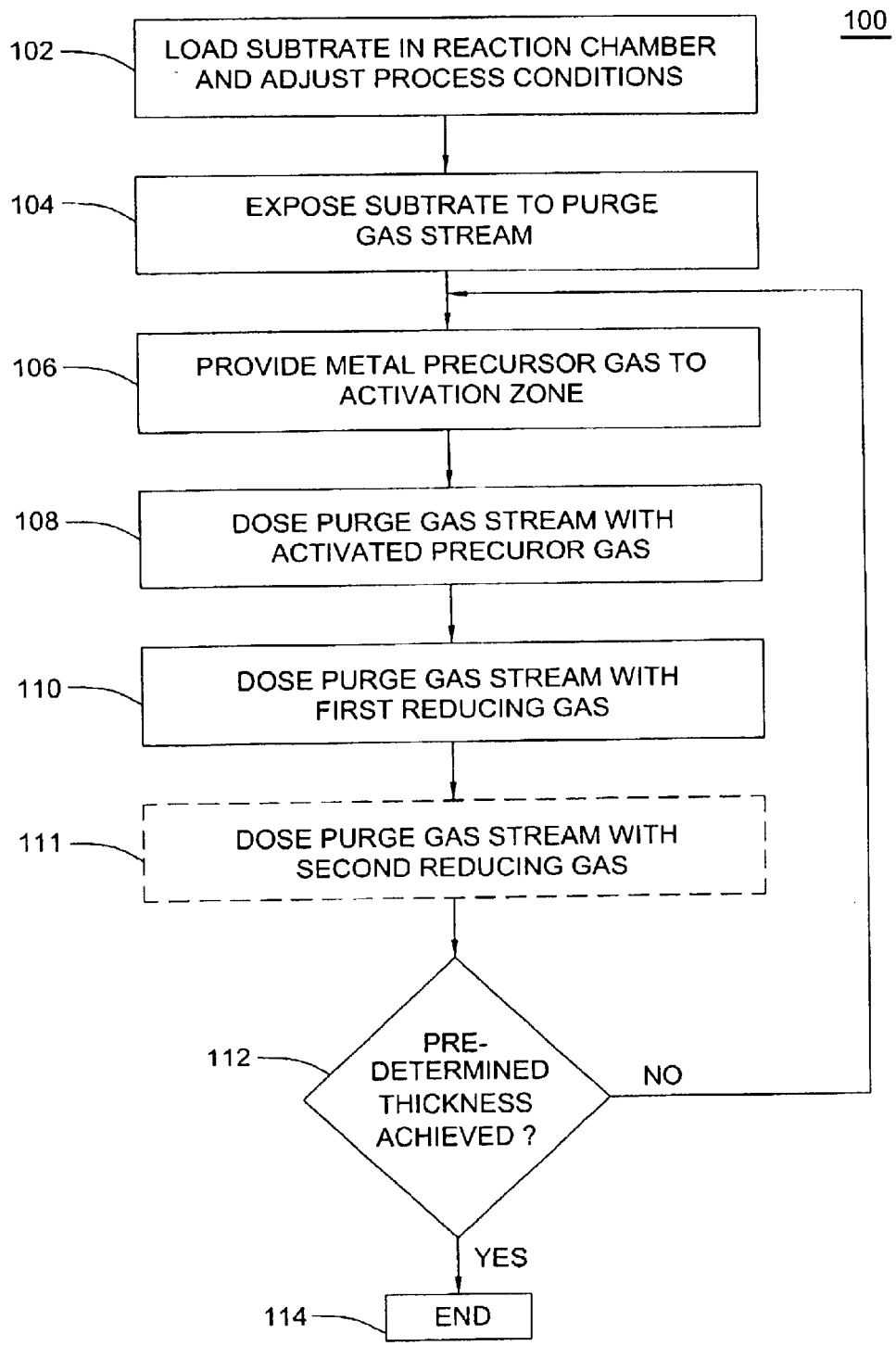
FIG. 3 illustrates a process flow sequence for film deposition using cyclical deposition techniques according to embodiments described herein.

FIG. 3 illustrates an exemplary process sequence 100 for depositing films according using a processing chamber similar to that described above with reference to FIGS. 1–2. Steps 104 through 111 describe one embodiment of a deposition cycle in which a constant flow of carrier gas is provided to the process chamber modulated by alternating periods of pulsing of either activated precursor gas or activated reducing gas and periods of non-pulsing. The periods of pulsing may alternate between the activated precursor gas and the activated reducing gas along with the carrier gas stream, while the periods of non-pulsing include only the carrier gas stream. The term "pulse" as used herein refers to a dose of material injected into the reaction chamber or into the carrier gas stream.

As shown in step 102, a substrate is disposed within chamber. The substrate may be, for example, a semiconductor substrate, such as a silicon wafer or other substrate on which integrated circuits and other electronic devices are formed. The process chamber conditions, such as temperature and pressure, are adjusted to enhance the adsorption of the gases onto the substrate. In general, the chamber pressure and substrate temperature are variable and dependent upon the material to be deposited.

In one embodiment where a constant carrier gas flow is desired, a carrier gas stream is established within the reaction chamber as indicated in step 104. Carrier gases may be selected to also act as a purge gas for removal of volatile reactants and/or by-products from the process chamber. Carrier gases such as, for example, helium (He), argon (Ar), nitrogen ($N_2$) and hydrogen ($H_2$), and combinations thereof, among others may be used.

As shown in step 106, the metal-containing precursor is provided to an activation zone 55, such as the activation zone 55a of FIG. 2. The metal-containing precursor is activated to form an activated metal-containing precursor. The activated precursor is generally more chemically reactive than a non-activated metal precursor. The activation induces changes in the metal-containing precursor including, for example, reducing the oxidation state, reducing the number or density of ligands, or increasing a concentration of metallic species within the precursor. However, the activation does not involve a complete reduction of the metal-containing precursor to the point at which it will prematurely deposit or condense on a surface prior to contacting the substrate. The time required to activate the metal-containing precursor is variable and dependent upon the composition of the precursor, temperature of the activation zone, and pressure of the activation zone, among other well known considerations.

In one aspect, the metal-containing precursor may be transported to an activation zone 55a where the metal-containing precursor is activated by contacting the metal-containing precursor with a condensed phase catalytic material, such as, for example, a metal filament or other condensed phase catalyst described above. The metal-containing precursor may be activated at a pressure between about 1 Torr and about 10 Torr at a temperature between about 65° C. and about 200° C.

In another aspect, the metal-containing precursor may be activated using a gas phase catalytic material. The gas phase material may include, for example, metallic species in gaseous form, as described above. Preferably, the gas phase catalytic materials contain ammonia gas. The metal-containing precursor may be activated at a pressure between about 1 Torr and about 10 Torr at a temperature between about 65° C. and about 200° C.

In still another aspect, the metal-containing precursor may be activated by reacting the metal-containing precursor with a gas phase material that has been ignited into a plasma state at conditions commonly known in the art. The plasma may comprise ammonia, hydrogen, nitrogen, or combinations thereof. The plasma may further comprise an inert gas such as argon or helium. The metal-containing precursor may be activated at a pressure between about 1 Torr and about 10 Torr at a temperature between about 65° C. and about 200° C.

In yet another embodiment, the metal-containing precursor may be activated by reacting with a gas phase material that has been excited using microwave energy, infrared radiation, or ultraviolet radiation. In still yet another aspect, the metalcontaining precursor is thermally activated using a temperature between about 100° C. and about 350° C. at a pressure between about 1 Torr and about 10 Torr.

Referring to step 108, after the carrier gas stream is established within the process chamber, a pulse of metal-containing precursor that has been activated (i.e., a pulse of activated precursor gas) is added to the carrier gas stream. The pulse of the metal-containing precursor lasts for a predetermined time interval.

The time interval for each pulse of the metal-containing precursor is variable depending on the volume capacity of the process chamber employed as well as the vacuum system coupled thereto. In general, the process conditions are advantageously selected so that a pulse of the metal-containing precursor provides a sufficient amount of precursor so that at least a monolayer of the activated precursor is adsorbed on the substrate. Thereafter, excess metal-containing precursor remaining in the chamber may be removed from the process chamber by the constant carrier gas stream in combination with the vacuum system.

In step 110, after the excess of the activated precursor has been removed from the reaction chamber by the constant carrier gas stream, a pulse of a first reducing gas is added to the carrier gas stream. The pulse of the first reducing gas also lasts for a predetermined time interval that is variable as described above with reference to the activated precursor. In general, the time interval for the pulse of the first reducing gas should be long enough for adsorption of at least a monolayer of the first reducing gas on the activated precursor gas. Excess reducing gas is also removed therefrom by the constant carrier gas stream in combination with the vacuum system.

In one embodiment, an optional pulse of a second reducing gas is added to the carrier gas stream, as indicated in step 111. The second reducing gas generally reacts with any previously unreacted activated precursor that may be exist on the substrate. The pulse of the second reducing gas also lasts for a predetermined time interval that is variable as described above with reference to the precursor, and the pulse should be long enough for adsorption of at least a monolayer of the second reducing gas onto the first reducing gas. Thereafter, excess second reducing gas remaining in the chamber is removed therefrom by the constant carrier gas stream in combination with the vacuum system.

Referring to step 112, after each deposition cycle (steps 104 through 111) a thickness of the film will be determined. Depending on specific device requirements, subsequent deposition cycles may be needed to achieve a desired thickness. If so, steps 104 through 111 are repeated until the desired thickness for the film is achieved. Thereafter, when the desired thickness for the film is achieved, the process is stopped as indicated by step 114.

Figure 4:
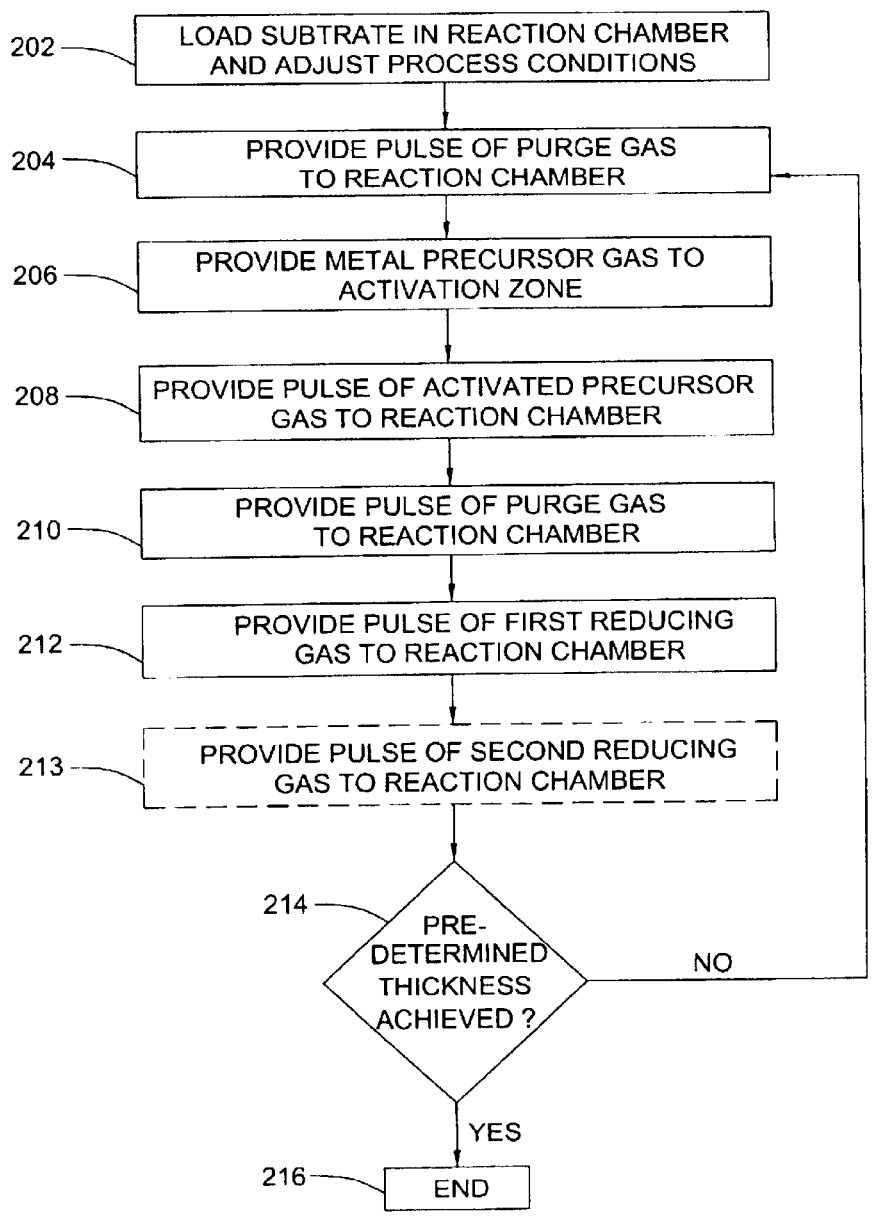
FIG. 4 illustrates a process flow sequence for film deposition using cyclical deposition techniques according to an alternate embodiment described herein.

FIG. 4 shows an alternate deposition process sequence 200. The sequence 200 includes providing a substrate to the reaction chamber (step 202), providing a first pulse of a purge gas to the reaction chamber (step 204), providing a first pulse of the metal-containing precursor to an activation zone (step 206), providing the pulse of activated precursor to the reaction chamber (step 208), providing a second pulse of the purge gas to the reaction chamber (step 210), providing a first pulse of a first reducing gas to the reaction chamber (step 212), providing an optional pulse of a second reducing gas to the reaction chamber (step 213) and then repeating steps 204 through 213 or stopping the deposition process (step 214) depending on whether a desired thickness for the film has been achieved. The metal-containing precursor may be activated using any of the embodiments described above with reference to FIG. 3.

The time intervals for each of the pulses of the activated precursor gas, the one or more reducing gases and the purge gas may have the same durations as discussed above with respect to FIG. 3. Alternatively, the time intervals for each of the pulses of the activated precursor gas, the one or more reducing gases and the purge gas may have different durations.

Figure 5:
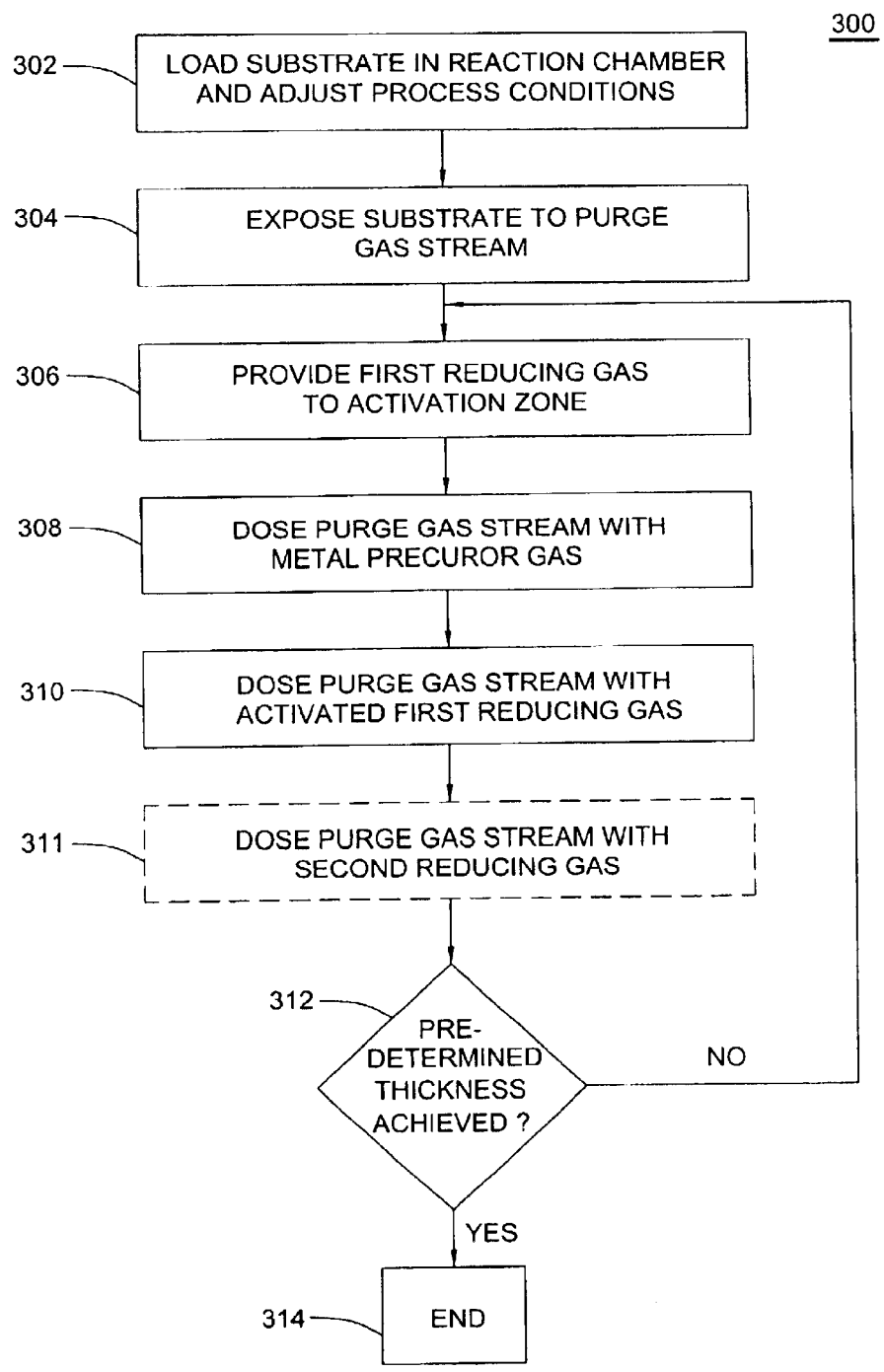
FIG. 5 illustrates a process flow sequence for film deposition using cyclical deposition techniques according to another alternate embodiment described herein.

FIG. 5 shows yet another alternate process sequence 300. The deposition sequence 300 includes providing a substrate to the reaction chamber (step 302) and exposing the substrate to a purge gas stream (step 304). A first reducing gas is provided to an activation zone (step 306), such as activation zone 55b shown in FIG. 2. The first reducing gas is activated to form an activated reducing gas. In general, the activation induces a change in the first reducing gas that enhances the reactivity of the first reducing gas.

In one embodiment, the activation may comprise, for example, igniting the first reducing gas into a plasma state. In one aspect of this embodiment, the plasma may be generated using microwave energy of about 1,000 W at 2.56 gHz. In another aspect of this embodiment, the plasma may be generated using RF power of about 1,000 W at 13.56 mHz.

In another embodiment, the activation may consist of exposing the reducing gas to a source of radiation, such as a source of infrared or ultraviolet radiation. The source of radiation may be, for example, a lamp or a laser. In still yet another embodiment, the activation includes heating the reducing gas using a hot filament to a temperature between about 500° C. and about 1,000° C.

The film deposition sequence 300 is completed by pulsing the purge gas with the metal-containing precursor (step 308), pulsing the purge gas stream with the activated first reducing gas (step 310), optionally pulsing the purge gas stream with a second reducing gas (step 311), and repeating steps 304 through 311 or stopping the deposition process (step 314) depending on whether a desired thickness for the film has been achieved.

In FIGS. 3–5, the film deposition sequences 100, 200, 300 are depicted as beginning with a dose or pulse of a metal-containing precursor, followed by a dose or pulse of a reducing gas. Alternatively, the film deposition sequences may start with a dose or pulse of a reducing gas followed by a dose or pulse of a metal-containing precursor. Furthermore, in FIGS. 3–5, the film deposition sequences are depicted as including steps in which either the metal-containing precursor or the first reducing gas are activated. Alternatively, both the metal-containing precursor and the first reducing gas may be activated. In addition, for any of the film deposition sequences 100, 200, 300, the second reducing gas may be provided to an activation zone and activated in a manner similar to those described for the first reducing gas.

The films deposited according to the cyclical deposition techniques described above may include a refractory metal nitride, refractory metal silicide, refractory metal nitrogen silicide, and a refractory metal boride, among other metal compounds. Such refractory metals include titanium (Ti), tantalum (Ta), tungsten (W), vanadium (V), niobium (Nb), zirconium (Zr), hafnium (Ha), chromium (Cr), and molybdenum (Mo).

More particularly, the film may include tantalum, tantalum nitride, titanium, titanium nitride, and combinations thereof. Exemplary tantalum-containing precursors include $Ta(NMe_2)_5$ (PDMAT), $Ta(NEt_2)_5$ (PDEAT), $Ta(NMeEt)_5$ (PEMAT), $^tBuNTa(NEt_2)_3$ (TBTDET), $^tBuNTa(NMeEt)_3$ (TBTMET), $^tBuNTa(NMe_2)_3$ (TBTDMT), tantalum chloride ($TaCl_5$), tantalum bromide ($TaBr_5$), tantalum iodide ($TaI_5$), tantalum hydrides, such as $(Cp)_2TaH_3$ or $(CpMe)_2TaH_3$, and combinations thereof. Exemplary titanium-containing precursors for forming titanium layers include TDMAT, TDEAT, titanium chloride ($TiCl_4$), and combinations thereof. Exemplary tungsten-containing precursors include tungsten hexacarbonyl ($W(CO)_6$), tungsten pentacarbonyl compounds ($RW(CO)_5$) and tungsten tetracarbonyl compounds ($R_2W(CO)_4$) where R is an alkylisonitrile group (R'—N=C=), where R' is an alkyl group such as n-butyl, 1-ethylpropyl, isopentyl, n-pentyl, n-hexyl, and n-octyl. In the above chemical formulas, the abbreviations Me and Et are used for methyl (—$CH_3$) and ethyl (—$C_2H_5$) groups respectively.

Suitable reducing gases may include, for example, ammonia ($NH_3$), hydrazine ($N_2H_4$), monomethyl hydrazine ($CH_3N_2H_3$), dimethyl hydrazine ($C_2H_6N_2H_2$), t-butyl hydrazine ($C_4H_9N_2H_3$), phenyl hydrazine ($C_6H_5N_2H_3$), 2,2'-azoisobutane (($CH_3$)$_6C_2N_2$), ethylazide ($C_2H_5N_3$), silane ($SiH_4$), disilane ($Si_2H_6$), dichlorosilane ($SiCl_2H_2$), borane ($BH_3$), diborane ($B_2H_6$), triborane, tetraborane, pentaborane, hexaborane, heptaborane, octaborane, nonaborane and decaborane, among others. Combinations of these and other reducing gases may be used to promote optimal activation of the metal-containing precursor adsorbed on the substrate.

One exemplary process of depositing a film using embodiments described herein involves the deposition of a tantalum nitride film. To deposit the tantalum nitride film, a substrate is loaded into a reaction chamber. A continuous purge gas, such as helium is introduced into the chamber to stabilize the temperature of the substrate between about 20° C. and about 350° C., such as about 250° C. and the pressure of the chamber between about 1 mTorr and about 50 Torr. A tantalum-containing precursor, such as PDMAT for example, is pulsed into the reaction chamber via a first activation zone where the PDMAT is thermally activated at a temperature between about 70° C. and about 200° C., such as between about 100° C. and about 120° C., at a pressure between about 1 Torr and about 50 Torr, preferably 1 Torr to 10 Torr. A reducing gas, such as ammonia ($NH_3$) for example, is then pulsed into the reaction chamber via a second activation zone and activated using RF power of about 500 W to about 1,500 W at 13.56 mHz. Alternatively, the ammonia can be activated using thermal decomposition by heating the ammonia to a temperature between about 500° C. and about 1,000° C. The pulses of PDMAT and ammonia are alternately introduced to the substrate surface until a conformal tantalum nitride layer having a thickness of about 10 Angstroms (Å) is formed.

Integrated Circuit Fabrication Processes

Figure 6A:
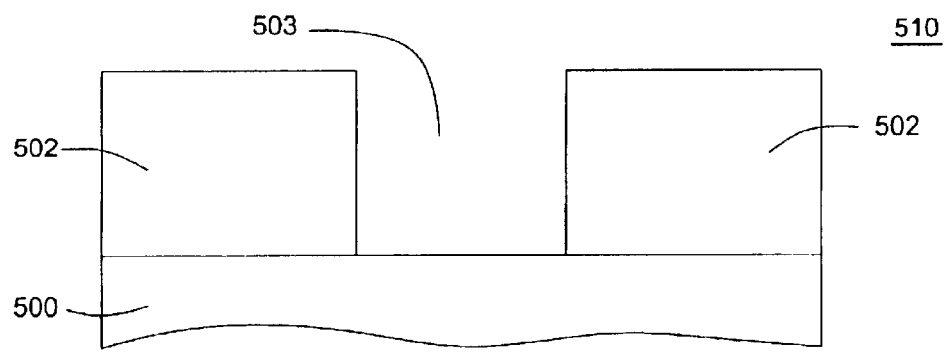
FIGS. 6A–6C depict cross-sectional views of a substrate at different stages of an interconnect fabrication sequence.
Figure 6B:
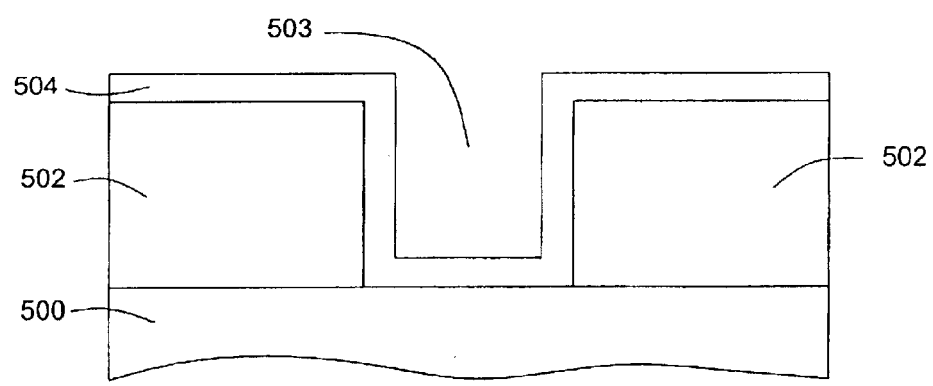
Figure 6C:
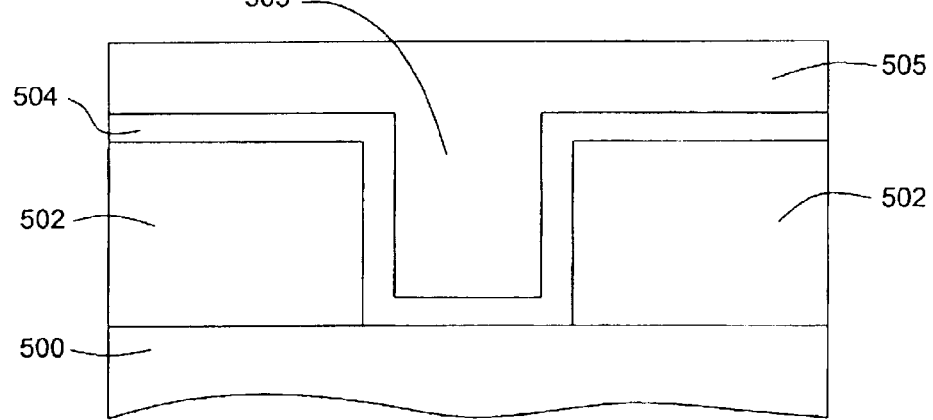

FIGS. 6A–6C illustrate a partial cross-section view of a substrate at different stages of an interconnect fabrication sequence incorporating a barrier layer formed using a film deposition process consistent with embodiments described herein. FIG. 6A, for example, illustrates a cross-section view of a substrate structure 510, comprising, for example, a substrate 500 having a material layer 502 formed atop substrate 500. The substrate 500 may comprise a semiconductor material such as, for example, silicon (Si). Material layer 502 may be, for example, an oxide. A via 503 formed in layer 502 exposes portions of substrate 500. The via 503 is formed using conventional lithography and etching techniques.

Referring to FIG. 6B, a barrier layer 504 is formed over material layer 502. The barrier layer 504 may comprise, a refractory metal, such as, for example, tantalum or titanium. In one embodiment, barrier layer comprises a refractory metal nitride, such as tantalum nitride or titanium nitride. In one embodiment, barrier layer 504 comprises multiple material layers, such as one or more metal layers and metal nitride layers. The thickness of the barrier layer 504 is typically about 10 Å to about 1000 Å.

After the barrier layer 504 is formed, the interconnect is completed by filling the via 503 with, for example, a metal layer 505, as shown in FIG. 6C. The metal layer 504 may be formed using conventional deposition techniques. For example, the metal layer 504 may be deposited using electroplating, chemical vapor deposition (CVD) or physical vapor deposition. Metal layer 504 may comprise, for example, copper or aluminum.

While the foregoing is directed to the preferred embodiment of the present invention, other and further embodiments of the invention may be devised without departing from the basic scope thereof, and the scope thereof is determined by the claims that follow.

What is claimed is:

1. A method for depositing a film on a substrate surface, comprising:
   providing a metal-containing precursor to an activation zone;
   activating the metal-containing precursor to form an activated metal precursor, wherein activating the metal-containing precursor comprises reacting the metal-containing precursor with a gas phase material containing one or more metallic species selected from the group consisting of sodium, potassium, rubidium, cesium, francium, lithium, beryllium, magnesium, calcium, strontium, barium, radium, and combinations thereof; and
   alternately adsorbing the activated metal precursor and a first reducing gas to deposit the film on the substrate surface.

2. The method of claim 1, wherein the gas phase material further comprises ammonia.

3. The method of claim 2, wherein the film comprises a material selected from the group consisting of tantalum, tantalum nitride, titanium, titanium nitride, tungsten, tungsten nitride, and combinations thereof.

4. The method of claim 3, wherein the metal-containing precursor comprises a material selected from the group consisting of PDMAT, PDEAT, PEMAT, TBTDET, TBTMET, TBTDMT, tantalum chloride, tantalum bromide, tantalum iodide, $(Cp)_2TaH_3$, $(CpMe)_2TaH_3$, TDMAT, TDEAT, titanium chloride, and combinations thereof.

5. The method of claim 1, wherein activating the metal-containing precursor further comprises reacting the metal-containing precursor with a plasma of hydrogen radicals, nitrogen radicals, or hydrogen and nitrogen radicals.

6. The method of claim 1, wherein activating the metal-containing precursor further comprises exciting the gas phase material with a radiation source and reacting the gas phase material with the metal-containing precursor.

7. The method of claims 1, wherein the first reducing gas is selected from the group consisting of ammonia, hydrogen, hydrazine, monomethyl hydrazine, dimethyl hydrazine, t-butyl hydrazine, phenyl hydrazine, 2,2'-azoisobutane, ethylazide, silane, disilane, dichlorosilane, borane, diborane, triborane, tetraborane, pentaborane, and combinations thereof.

8. The method of claim 7, wherein a cyclical deposition process comprises a plurality of cycles, wherein each cycle comprises establishing a flow of an inert gas to a process chamber and modulating the flow of the inert gas with an alternating period of exposure to one of either the activated metal precursor or the first reducing gas.

9. A method for forming a film on a substrate, comprising:
   providing a metal-containing precursor to an activation zone;
   activating the metal-containing precursor to form an activated precursor gas, wherein activating the metal-containing precursor comprises reacting the metal-containing precursor with a gas phase material containing one or more metallic species selected from the group consisting of sodium, potassium, rubidium, cesium, francium, lithium, beryllium, magnesium, calcium, strontium, barium, radium, and combinations thereof;
   providing a first reducing gas to the activation zone;
   activating the first reducing gas to form an activated reducing gas; and
   depositing the film on the substrate using a cyclical deposition process, wherein the activated reducing gas and the active precursor gas are alternately adsorbed on the substrate.

10. The method of claim 9, wherein the gas phase material further comprises ammonia.

11. The method of claim 10, wherein the film comprises a material selected from the group consisting of tantalum, tantalum nitride, titanium, titanium nitride, and combinations thereof.

12. The method of claim 11, wherein the metal-containing precursor comprises a material selected from the group consisting of PDMAT, PDEAT, PEMAT, TBTDET, TBTMET, TBTDMT, tantalum chloride, tantalum bromide, tantalum iodide, $(Cp)_2TaH_3$, $(CpMe)_2TaH_3$, TDMAT, TDEAT, titanium chloride, and combinations thereof.

13. The method of claim 12, wherein the first reducing gas is selected from the group consisting of ammonia, hydrogen, hydrazine, monomethyl hydrazine, dimethyl hydrazine, t-butyl hydrazine, phenyl hydrazine, 2,2'-azoisobutane, ethylazide, silane, disilane, dichlorosilane, borane, diborane, triborane, tetraborane, pentaborane, and combinations thereof.

14. The method of claim 9, wherein activating the metal-containing precursor further comprises igniting the gas phase material into a plasma state and reacting the gas phase material with the metal precursor gas.

15. The method of claim 9, wherein activating the metal-containing precursor further comprises exciting the gas phase material with a radiation source and reacting the gas phase material with the metal-containing precursor.

16. A method for depositing a film on a substrate surface, comprising:
   providing a tantalum-containing precursor to an activation zone;
   activating the tantalum-containing precursor to form an activated tantalum-precursor by reacting the tantalum-containing precursor with a material containing one or more elements selected from the group consisting of sodium, potassium, rubidium, cesium, francium, lithium, beryllium, magnesium, calcium, strontium, barium, radium, and combinations thereof; and
   alternately pulsing the activated tantalum-precursor and a reductant to deposit the film.

17. The method of claim 16, wherein the tantalum-containing precursor is PDMAT.

18. The method of claim 17, wherein the reductant is ammonia.

19. A method for depositing a film on a substrate surface, comprising:
   providing PDMAT to an activation zone;
   activating the PDMAT to form an activated tantalum-precursor by reacting the PDMAT with a material containing one or more elements selected from the group consisting of sodium, potassium, rubidium, cesium, francium, lithium, beryllium, magnesium, calcium, strontium, barium, radium, and combinations thereof; and alternately pulsing the activated tantalum-precursor and ammonia to deposit the film.

20. A method for depositing a film on a substrate surface, comprising:

provi ding a metal-containing precursor to an activation zone;

activating the metal-containing precursor to form an activated metal-precursor by reacting the metal-containing precursor with a material containing one or more elements selected from the group consisting of sodium, potassium, rubidium, cesium, francium, lithium, beryllium, magnesium, calcium, strontium, barium, radium, and combinations thereof; and sequentially exposing the substrate surface to pulses of the activated metal-precursor and a reductant to deposit the film.

21. The method of claim 20, wherein the film comprises a material selected from the group consisting of tantalum, tantalum nitride, titanium, titanium nitride, tungsten, tungsten nitride, and combinations thereof.

22. The method of claim 21, wherein the metal-containing precursor comprises a material selected from the group consisting of PDMAT, PDEAT, PEMAT, TBTDET, TBTMET, TBTDMT, tantalum chloride, tantalum bromide, tantalum iodide, $(Cp)_2TaH_3$, $(CpMe)_2TaH_3$, TDMAT, TDEAT, titanium chloride, and combinations thereof.

23. The method of claim 22, wherein the reductant is selected from the group consisting of ammonia, hydrogen, hydrazine, methylhydrazine, dimethylhydrazine, tertbutylhydrazine, phenylhydrazine, 2,2'-azoisobutane, ethylazide, silane, disilane, dichlorosilane, borane, diborane, triborane, tetraborane, pentaborane, and combinations thereof.

24. The method of claim 23, wherein the metal-containing precursor is PDMAT and the reductant is ammonia.

* * * * *

UNITED STATES PATENT AND TRADEMARK OFFICE
CERTIFICATE OF CORRECTION

PATENT NO. : 6,838,125 B2
APPLICATION NO. : 10/193574
DATED : January 4, 2005
INVENTOR(S) : Hua Chung, Ling Chen and Vincent W. Ku It is certified that error appears in the above-identified patent and that said Letters Patent is hereby corrected as shown below:

<u>In the Specification</u>

Column 4, Line 53: Before "process", insert --more--

Column 4, Line 61: Delete "according"

Column 6, Line 5: Change "metalcontaining" to --metal-containing--

Column 6, Line 40: Before "exists", delete "be"

Column 8, Line 6: Change "(Ta1$_5$)" to --TaI$_5$--

<u>In the Claims</u>

Column 9, Claim 7, Line 57: Change "claims" to --claim--

Signed and Sealed this

Twenty-ninth Day of August, 2006

JON W. DUDAS
*Director of the United States Patent and Trademark Office*